United States Patent
Miyazaki

(10) Patent No.: US 10,391,529 B2
(45) Date of Patent: Aug. 27, 2019

(54) EXHAUST SYSTEM, SEMICONDUCTOR MANUFACTURING EQUIPMENT, AND METHOD FOR OPERATING THE EXHAUST SYSTEM

(71) Applicant: Toshiba Memory Corporation, Minato-ku (JP)

(72) Inventor: Shinji Miyazaki, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 277 days.

(21) Appl. No.: 15/414,131

(22) Filed: Jan. 24, 2017

(65) Prior Publication Data

US 2018/0085799 A1  Mar. 29, 2018

(30) Foreign Application Priority Data

Sep. 28, 2016  (JP) ................. 2016-190242

(51) Int. Cl.

| B08B 9/08 | (2006.01) |
| B08B 3/04 | (2006.01) |
| B08B 5/00 | (2006.01) |
| C23C 14/24 | (2006.01) |
| F04C 18/12 | (2006.01) |

(Continued)

(52) U.S. Cl.
CPC .................. *B08B 9/08* (2013.01); *B08B 3/04* (2013.01); *B08B 5/00* (2013.01); *B08B 15/02* (2013.01); *C23C 14/24* (2013.01); *C23C 16/4405* (2013.01); *C23C 16/4407* (2013.01); *C23C 16/4412* (2013.01); *F04C 18/126* (2013.01); *F04C 18/16* (2013.01); *F04C 23/001* (2013.01); *F04C 23/005* (2013.01);
(Continued)

(58) Field of Classification Search
CPC .... B09B 9/08; B08B 3/04; B08B 5/00; C23C 14/24; C23C 16/4408; F04C 18/126; F04C 18/16; F04C 23/001; F04C 23/005; F04C 29/0085
USPC ............. 418/1, 7, 15, 270, 201.1, 9, DIG. 1; 222/129, 132, 145.1
See application file for complete search history.

(56) References Cited

U.S. PATENT DOCUMENTS 4,601,645 A * 7/1986 Schmitkons ............ F04C 13/00
                                                        222/190
6,662,817 B2  12/2003 Yamagishi et al.
(Continued)

FOREIGN PATENT DOCUMENTS

| JP | 5-29227 | 2/1993 |
| JP | 2002-110570 | 4/2002 |
| JP | 2015-227618 | 12/2015 |

*Primary Examiner* — Deming Wan
(74) *Attorney, Agent, or Firm* — Oblon, McClelland, Maier & Neustadt, L.L.P.

(57) ABSTRACT

According to one embodiment, an exhaust system includes a first pump unit, a second pump unit, a shaft, and a motor. The first pump unit includes a first exhaust chamber, a first intake port, a first exhaust port, and a first rotor. The first intake port, the first exhaust port, and the first rotor are provided in the first exhaust chamber. The second pump unit includes a second exhaust chamber, a second intake port, a second exhaust port, and a second rotor. The second intake port, the second exhaust port, and the second rotor are provided in the second exhaust chamber. The shaft links the first rotor and the second rotor. The motor causes the first rotor, the second rotor, and the shaft to rotate.

17 Claims, 12 Drawing Sheets

(51) Int. Cl.
  *F04C 18/16* (2006.01)
  *F04C 23/00* (2006.01)
  *F04C 29/00* (2006.01)
  *B08B 15/02* (2006.01)
  *C23C 16/44* (2006.01)
  *F04C 29/12* (2006.01)
  *F04C 28/02* (2006.01)

(52) U.S. Cl.
  CPC ........ *F04C 29/0085* (2013.01); *F04C 29/124* (2013.01); *F04C 28/02* (2013.01); *F04C 2240/60* (2013.01)

(56) References Cited

U.S. PATENT DOCUMENTS

| | | | | |
|---|---|---|---|---|
| 7,156,922 B2* | 1/2007 | Muller | ................... | C23C 14/568 |
| | | | | 118/715 |
| 7,195,461 B2* | 3/2007 | Allington | ............... | B01D 15/12 |
| | | | | 417/44.2 |
| 2007/0224064 A1* | 9/2007 | Brand | ..................... | F04B 13/00 |
| | | | | 418/7 |

* cited by examiner

US 10,391,529 B2

EXHAUST SYSTEM, SEMICONDUCTOR MANUFACTURING EQUIPMENT, AND METHOD FOR OPERATING THE EXHAUST SYSTEM

CROSS-REFERENCE TO RELATED APPLICATIONS

This application is based upon and claims the benefit of priority from Japanese Patent Application No. 2016-190242, filed on Sep. 28, 2016; the entire contents of which are incorporated herein by reference.

FIELD

Embodiments described herein relate generally to an exhaust system, a semiconductor manufacturing equipment, and a method of operating the exhaust system.

BACKGROUND

Cyclic introduction, in which two types of material gases are caused to flow alternately in a chamber, is beginning to be developed as a method for forming a thin film utilizing a low pressure vapor deposition apparatus. In the case of cyclic introduction, the amount of the material gas consumed in the chamber is exceedingly low. Therefore, nearly all of the material gas that is introduced is exhausted from the chamber. The material gas is exhausted from the chamber by using a pump such as a dry vacuum pump, etc. When the material gas flows into the pump, by-products that are caused by the material gas are produced inside the pump. There is a possibility that the by-products may cause a decrease of the pump life by adhering to the pump, plugging the exhaust pipes, etc. It is desirable to increase the pump life.

DETAILED DESCRIPTION

Figure 1:
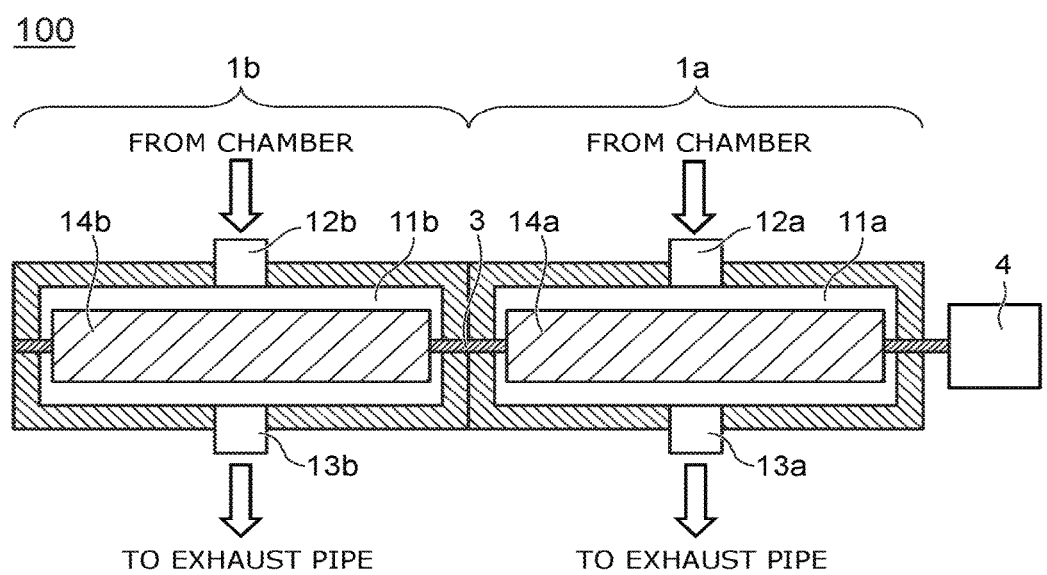
FIG. 1 is a schematic view showing the exhaust system according to the embodiment.

According to one embodiment, an exhaust system includes a first pump unit, a second pump unit, a shaft, and a motor. The first pump unit includes a first exhaust chamber, a first intake port, a first exhaust port, and a first rotor. The first intake port, the first exhaust port, and the first rotor are provided in the first exhaust chamber. The second pump unit includes a second exhaust chamber, a second intake port, a second exhaust port, and a second rotor. The second intake port, the second exhaust port, and the second rotor are provided in the second exhaust chamber. The shaft links the first rotor and the second rotor. The motor is configured to cause the first rotor, the second rotor, and the shaft to rotate.

Embodiments will now be described with reference to the drawings. The same components in the drawings are marked with the same reference numerals. An exhaust system that includes, for example, a vacuum pump and is used in, for example, semiconductor manufacturing equipment such as a low pressure vapor deposition apparatus, etc., is illustrated as the exhaust system in the embodiments.

<Exhaust System>

FIG. 1 is a schematic view showing the exhaust system 100 according to the embodiment.

FIG. 1 summarily shows the basic configuration of the exhaust system 100.

As shown in FIG. 1, the exhaust system 100 includes a first pump unit 1a, a second pump unit 1b, a shaft 3, and a motor 4.

The first pump unit 1a includes a first exhaust chamber 11a, a first intake port 12a, a first exhaust port 13a, and a first rotor 14a. The first intake port 12a, the first exhaust port 13a, and the first rotor 14a are provided in the first exhaust chamber 11a.

Similarly, the second pump unit 1b includes a second exhaust chamber 11b, a second intake port 12b, a second exhaust port 13b, and a second rotor 14b. The second intake port 12b, the second exhaust port 13b, and the second rotor 14b are provided in the second exhaust chamber 11b.

For example, the first intake port 12a and the second intake port 12b are connected to the chamber side of the low pressure vapor deposition apparatus. The first exhaust port 13a and the second exhaust port 13b are connected to the exhaust pipe side.

The shaft 3 links the first rotor 14a and the second rotor 14b. The motor 4 causes the first rotor 14a, the second rotor 14b, and the shaft 3 to rotate. The first rotor 14a and the second rotor 14b are rotated simultaneously by the shaft 3. The rotational speed of the first rotor 14a and the rotational speed of the second rotor 14b are, for example, the same.

<Vacuum Pump Utilizing Exhaust System>

Figure 2:
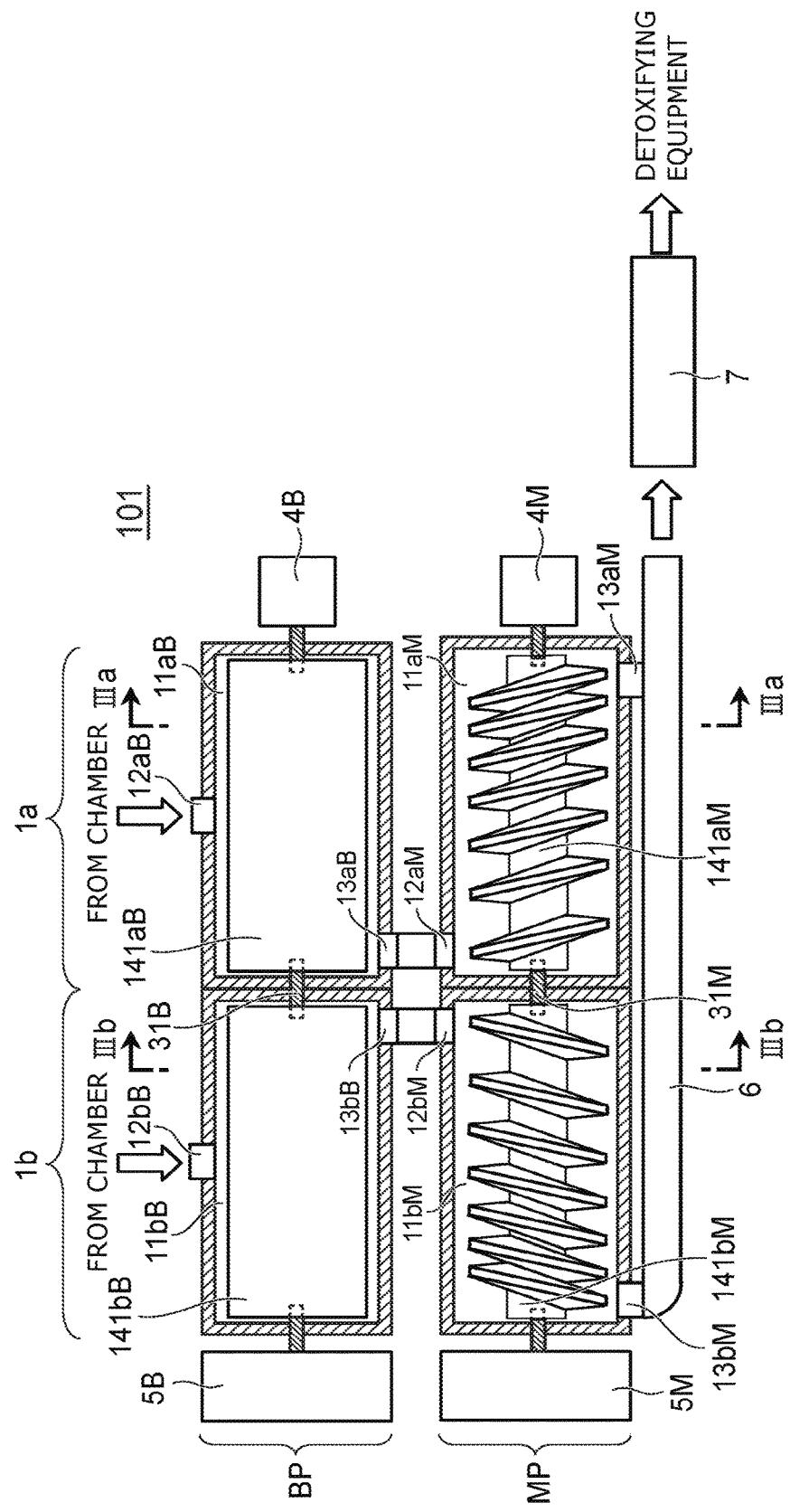
FIG. 2 is a schematic view showing an example of a vacuum pump utilizing the exhaust system according to the embodiment.
Figure 3A:
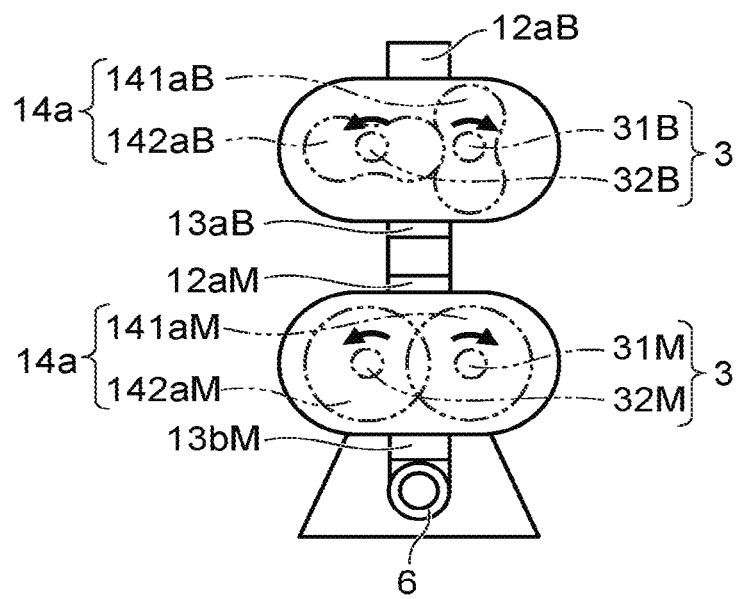
FIG. 3A is a cross-sectional view along line IIIc-IIIc in FIG. 2.
Figure 3B:
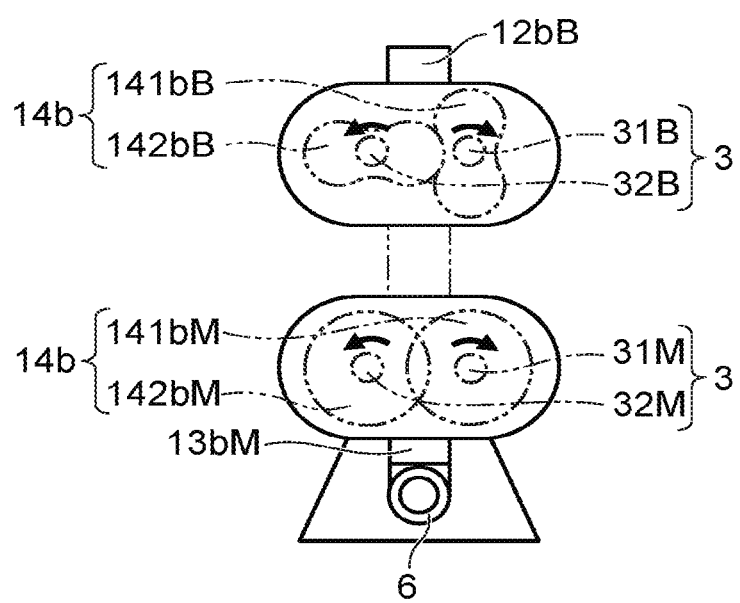
FIG. 3B is a cross-sectional view along line IIIb-IIIb in FIG. 2.
Figure 4:
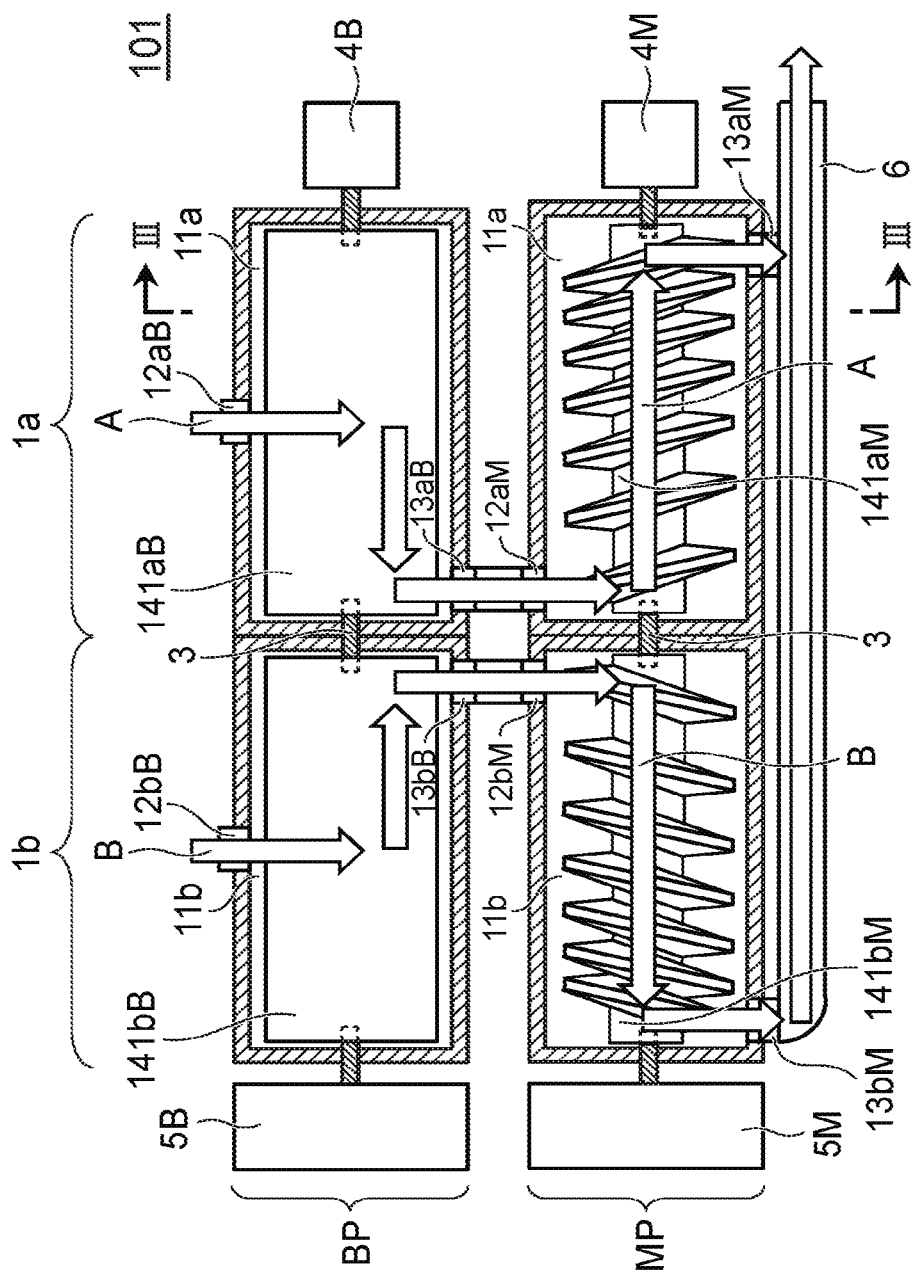
FIG. 4 is a schematic view showing the exhaust path of the vacuum pump shown in FIG. 2 and FIGS. 3A and 3B.

FIG. 2 is a schematic view showing an example of a vacuum pump utilizing the exhaust system 100 according to the embodiment. FIG. 3A is a cross-sectional view along line IIIc-IIIc in FIG. 2; and FIG. 3B is a cross-sectional view along line IIIb-IIIb in FIG. 2. FIG. 4 is a schematic view showing the exhaust path of the vacuum pump shown in FIG. 2 and FIGS. 3A and 3B.

As shown in FIG. 2 to FIG. 4, the vacuum pump 101 includes, for example, a booster pump BP and a main pump MP. The booster pump BP and the main pump MP include the basic configuration of the exhaust system 100 shown in FIG. 1. The booster pump BP and the main pump MP are, for example, dry pumps. For example, the booster pump BP and the main pump MP are connected in series between the exhaust pipe and the chamber of the semiconductor manufacturing equipment. For example, the booster pump BP is provided on the chamber side; and the main pump MP is provided on the exhaust pipe side.

The booster pump BP is, for example, a Roots pump. The Roots pump includes a pair of rotors 141aB and 142aB as the first rotor 14a inside a first exhaust chamber 11aB. Similarly, a pair of rotors 141bB and 142bB are included as the second rotor 14b inside a second exhaust chamber 11bB.

In the booster pump BP, the shaft 3 includes a pair of shafts 31B and 32B. The shaft 31B links the rotor 141aB and the rotor 141bB. The shaft 32B links the rotor 142aB and the rotor 142bB.

The rotors 141aB and 141bB and the shaft 31B are connected to the rotors 142aB and 142bB and the shaft 32B via a gear (not illustrated) provided inside a gear box 5B. A motor 4B causes the rotors 141aB and 141bB and the shaft 31B to rotate. Further, the rotors 142aB and 142bB and the shaft 32B are caused to rotate via the gear (not illustrated) inside the gear box 5B. The rotors 142aB and 142bB rotate in the reverse direction of the rotors 141aB and 141bB. The rotational speeds of the rotors 142aB and 142bB are, for example, the same as the rotational speeds of the rotors 141aB and 141bB.

The main pump MP is, for example, a screw pump. The screw pump includes a pair of rotors 141aM and 142aM as the first rotor 14a inside a first exhaust chamber 11aM. Similarly, a pair of rotors 141bM and 142bM is included as the second rotor 14b inside a second exhaust chamber 11bM.

In the main pump MP, the shaft 3 includes a pair of shafts 31M and 32M. The shaft 31M links the rotor 141aM and the rotor 141bM. The shaft 32M links the rotor 142aM and the rotor 142bM.

The rotors 141aM and 141bM and the shaft 31M are connected to the rotors 142aM and 142bM and the shaft 32M via a gear (not illustrated) provided inside a gear box 5M. A motor 4M causes the rotors 141aM and 141bM and the shaft 31M to rotate. Further, the rotors 142aM and 142bM and the shaft 32M are caused to rotate via the gear (not illustrated) inside the gear box 5M. The rotors 142aM and 142bM rotate in the reverse direction of the rotors 141aM and 141bM. The rotational speed is, for example, the same between the rotors 142aM and 142bM and the rotors 141aM and 141bM.

A first intake port 12aB and a second intake port 12bB of the booster pump BP are connected to the chamber side. A first exhaust port 13aB and a second exhaust port 13bB of the booster pump BP are connected to a first intake port 12aM and a second intake port 12bM of the main pump MP. A first exhaust port 13aM and a second exhaust port 13bM of the main pump MP are connected to an exhaust pipe 6. For example, the exhaust pipe 6 is connected to an in-plant exhaust pipe 7 mounted in the semiconductor device manufacturing plant. The in-plant exhaust pipe 7 is connected to detoxifying equipment.

The first pump unit 1a and the second pump unit 1b are provided in parallel in the vacuum pump 101. Therefore, for the exhaust paths as shown in FIG. 4, a first exhaust path A via the first pump unit 1a and a second exhaust path B via the second pump unit 1b exist independently.

For example, the structure of the first pump unit 1a and the structure of the second pump unit 1b are symmetric. As shown in FIG. 2 and FIG. 4, for example, the first pump unit 1a and the second pump unit 1b of the embodiment have a laterally symmetric structure. Therefore, the exhaust capacity of the first pump unit 1a and the exhaust capacity of the second pump unit 1b can be set to be equal.

Although the booster pump BP is a Roots-type and the main pump MP is a screw-type in the vacuum pump 101 of the embodiment, the combination of the Roots-type and the screw-type is arbitrary. Of course, both the booster pump BP and the main pump MP may be the Roots-type; and both may be the screw-type. Pumps of methods different from the Roots-type and the screw-type may be used.

Figure 5:
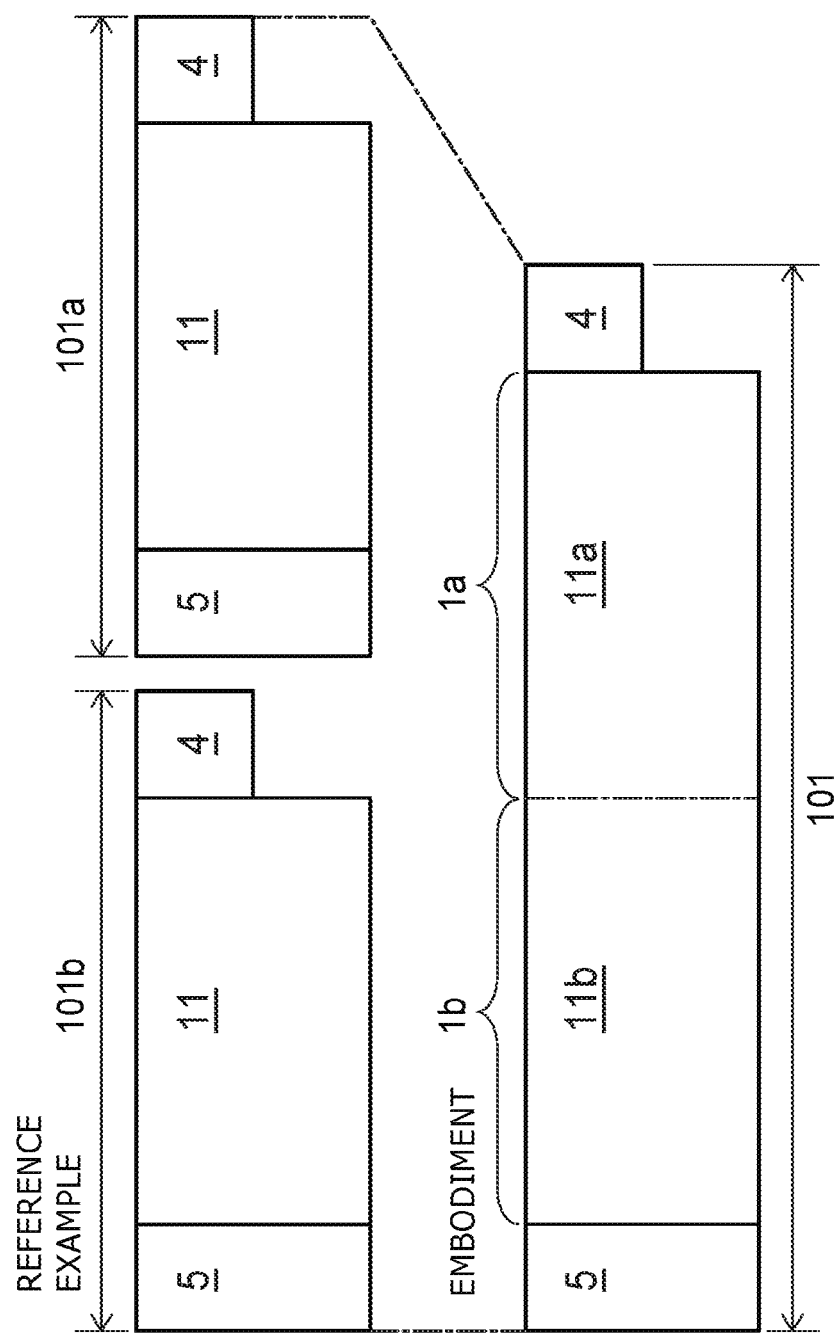
FIG. 5 is a schematic view showing a comparison of the embodiment and a reference example.

FIG. 5 is a schematic view showing a comparison of the embodiment and a reference example.

As shown in FIG. 5, in the vacuum pump 101 of the embodiment, one motor 4 and one gear box 5 are shared between the first pump unit 1a and the second pump unit 1b. Therefore, for example, compared to the case where two pumps, i.e., a vacuum pump 101a and a vacuum pump 101b, are arranged on one plane as in the reference example, for example, the space of one motor 4 and the space of one gear box 5 can be conserved. Accordingly, better space conservation is possible in the vacuum pump 101 compared to the case where the vacuum pumps 101a and 101b are arranged on one plane.

Although an example is shown in FIG. 5 in which the vacuum pumps 101, 101a, and 101b are arranged laterally, the effect of better space conservation can be obtained even in the case where the vacuum pumps 101, 101a, and 101b are arranged vertically.

<First Example of Semiconductor Manufacturing Equipment>

Figure 6:
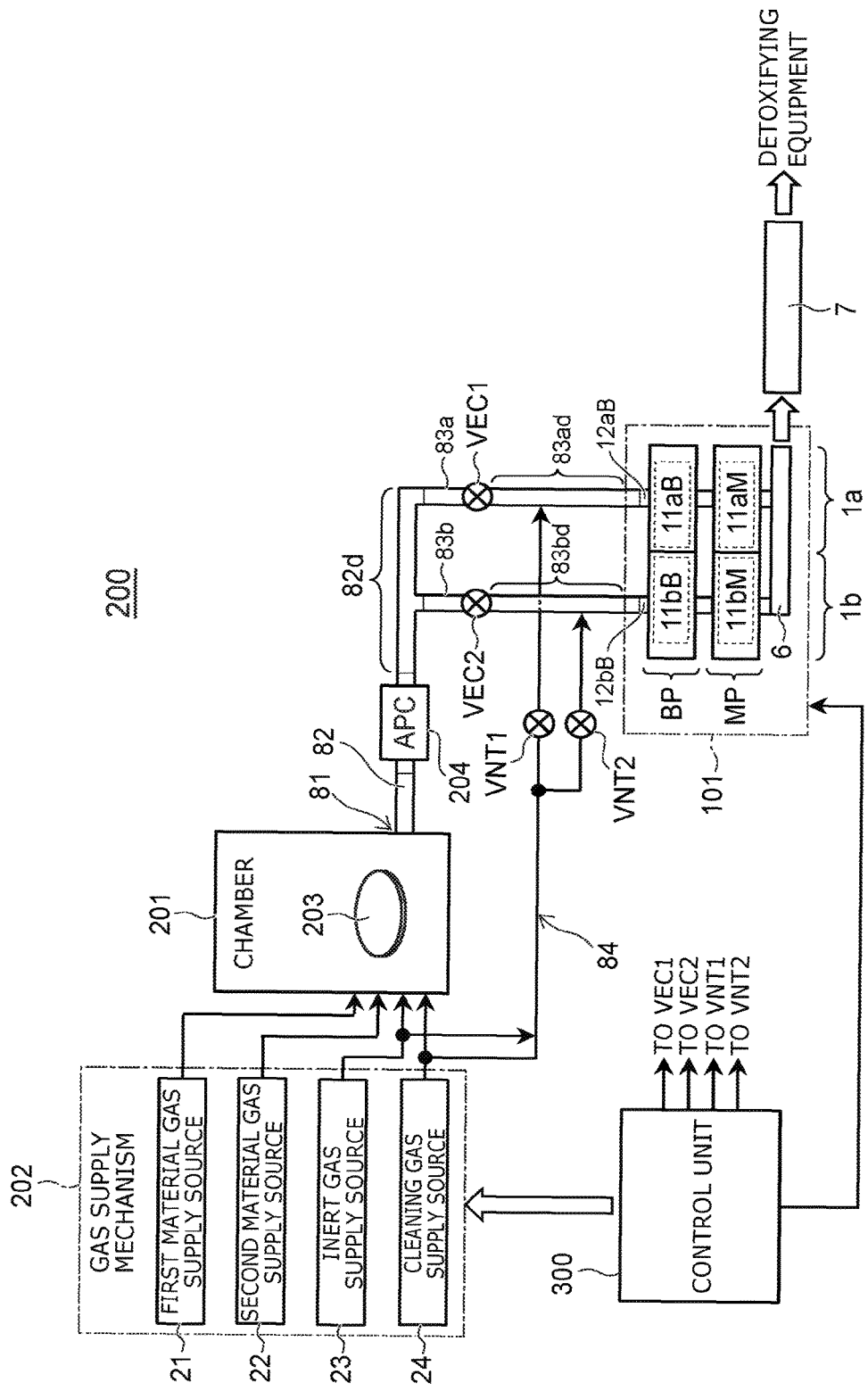
FIG. 6 is a schematic block diagram showing a first example of semiconductor manufacturing equipment using a vacuum pump.

FIG. 6 is a schematic block diagram showing a first example of semiconductor manufacturing equipment using the vacuum pump 101.

As shown in FIG. 6, the semiconductor manufacturing equipment 200 includes a chamber 201, a gas supply mechanism 202, the vacuum pump (the exhaust system) 101, and a control unit 300. A processing body 203 is transferred into the chamber 201; and processing of the transferred processing body 203 is performed. The processing body 203 is, for example, a semiconductor wafer. The semiconductor wafer is, for example, a silicon wafer. An example of the processing is, for example, film formation. For example, a thin film is formed on the silicon wafer inside the chamber 201. The thin film is, for example, a film used to manufacture a semiconductor device such as a silicon film, an oxide film, a nitride film, an oxynitride film, etc. For example, a low pressure vapor deposition apparatus in which it is possible to form a silicon oxynitride film, etc., by low pressure vapor deposition is shown as one example of the semiconductor manufacturing equipment 200 in the embodiment.

The gas supply mechanism 202 includes, for example, a first material gas supply source 21, a second material gas supply source 22, an inert gas supply source 23, and a cleaning gas supply source 24.

For example, the first material gas supply source 21 supplies silicon material gas to the chamber 201 as a first material gas. It is sufficient for the silicon material gas to be a gas including silicon. As an example of the gas including silicon, for example, a gas including DCS (dichlorosilane),
a gas including HCD (hexachlorodisilane),
a gas including 3DMAS (tris(dimethylamino)silane), or
a gas including DIPAS (diisopropyl aminosilane)

can be used. It is also possible for the first material gas supply source 21 to simultaneously supply the gases recited above to the chamber 201 or selectively supply at least one of the gases recited above.

As a second material gas, for example, the second material gas supply source 22 supplies, to the chamber 201, an oxidative/nitrative gas that can oxidize, nitride, or oxynitride silicon. It is sufficient for the oxidative/nitrative gas to be a gas including oxygen/nitrogen. As examples of the oxidative/nitrative gas, for example, a gas including $O_2$, or a gas including $NH_3$ can be used. For the second material gas supply source 22 as well, similarly to the first material gas supply source 21, for example, it is possible to supply the gas including $O_2$ and the gas including $NH_3$ simultaneously or separately to the chamber 201.

The inert gas supply source 23 supplies an inert gas to the chamber 201. For example, $N_2$ gas can be used as an example of the inert gas.

The cleaning gas supply source 24 supplies a cleaning gas to the chamber 201. For example, it is sufficient for the cleaning gas to be a gas that can remove a silicon film, a silicon oxide film, a silicon nitride film, a silicon oxynitride film, etc. As an example of such a cleaning gas, a gas including a halogen can be used. As examples of the gas including a halogen usable as the cleaning gas, for example, a gas including $ClF_3$, a gas including $F_2$, or a gas including HF can be used. It is also possible for the cleaning gas supply source 24 to supply the gases recited above simultaneously to the chamber 201 or selectively supply at least one of the gases recited above.

A chamber exhaust port 81 of the chamber 201 is connected to the intake port of the vacuum pump 101. In the semiconductor manufacturing equipment 200 of the embodiment, the chamber exhaust port 81 is connected to a first exhaust pipe 82.

An automatic pressure control device (APC) 204 is provided partway through the first exhaust pipe 82. A portion 82d of the first exhaust pipe 82 downstream from the APC 204 is connected to the first intake port 12aB via a second exhaust pipe 83a. Similarly, the portion 82d of the first exhaust pipe 82 downstream from the APC 204 is connected to the second intake port 12bB via a third exhaust pipe 83b. Downstream refers to being between the APC 204 and the intake port of the vacuum pump 101. A valve VEC1 is provided partway through the second exhaust pipe 83a. Similarly, a valve VEC2 is provided partway through the third exhaust pipe 83b. The valves VEC1 and VEC2 are valves capable of allowing the gas used in the processing to flow.

In the semiconductor manufacturing equipment 200 of the embodiment, the inert gas supply source 23 and the cleaning gas supply source 24 are connected to the chamber 201. Also, for example, the inert gas supply source 23 and the cleaning gas supply source 24 are connected to the vacuum pump 101 via a vent line 84. The inert gas supply source 23 and the cleaning gas supply source 24 are connected to a downstream portion 83ad of the second exhaust pipe 83a and a downstream portion 83bd of the third exhaust pipe 83b. The downstream portion 83ad of the second exhaust pipe 83a is the portion between the valve VEC1 and the first intake port 12aB. Similarly, the downstream portion 83bd of the third exhaust pipe 83b is the portion between the valve VEC2 and the second intake port 12bB.

The vent line 84 is connected to the downstream portion 83ad of the second exhaust pipe 83a via, for example, a valve VNT1 and is connected to the downstream portion 83bd of the third exhaust pipe 83b via, for example, a valve VNT2. The valves VNT1 and VNT2 are valves capable of allowing the cleaning gas and/or the inert gas to flow.

The control unit 300 controls the semiconductor manufacturing equipment 200. For example, the control unit 300 controls the vacuum pump 101, the gas supply mechanism 202, and the valves VEC1, VEC2, VNT1, and VNT2. For example, the control unit 300 executes ON/OFF and motor rotation speed adjustment of the vacuum pump 101

Gas supply start/stop and gas flow rate adjustment of the first material gas supply source 21

Gas supply start/stop and gas flow rate adjustment of the second material gas supply source 22

Gas supply start/stop and gas flow rate adjustment of the inert gas supply source 23

Gas supply start/stop and gas flow rate adjustment of the cleaning gas supply source 24

Open/close and valve opening degree adjustment of the valve VEC1

Open/close and valve opening degree adjustment of the valve VEC2

Open/close and valve opening degree adjustment of the valve VNT1

Open/close and valve opening degree adjustment of the valve VNT2 and the like according to, for example, a process recipe. It is also possible for the control unit 300 to execute the controls recited above according to an operation by an operator.

The vacuum pump 101 that includes the exhaust system 100 of the embodiment can be used in, for example, the semiconductor manufacturing equipment 200 such as that shown in FIG. 6.

As shown in FIG. 6, the vacuum pump 101 is provided in parallel with the first pump unit 1a and the second pump unit 1b. Therefore, for the exhaust paths as shown in FIG. 4, the first exhaust path A via the first pump unit 1a and the second exhaust path B via the second pump unit 1b exist independently.

According to the semiconductor manufacturing equipment 200 including such a vacuum pump 101, for example, operation methods such as the following (A) to (C) are possible by the open/close control of the valves VEC1, VEC2, VNT1, and VNT2.

(A) The first pump unit 1a and the second pump unit 1b are used alternately.

(B) The first pump unit 1a and the second pump unit 1b are used simultaneously.

(C) The first pump unit 1a and the second pump unit 1b are used in series.

<First Example of Operation Method>

Figure 7:
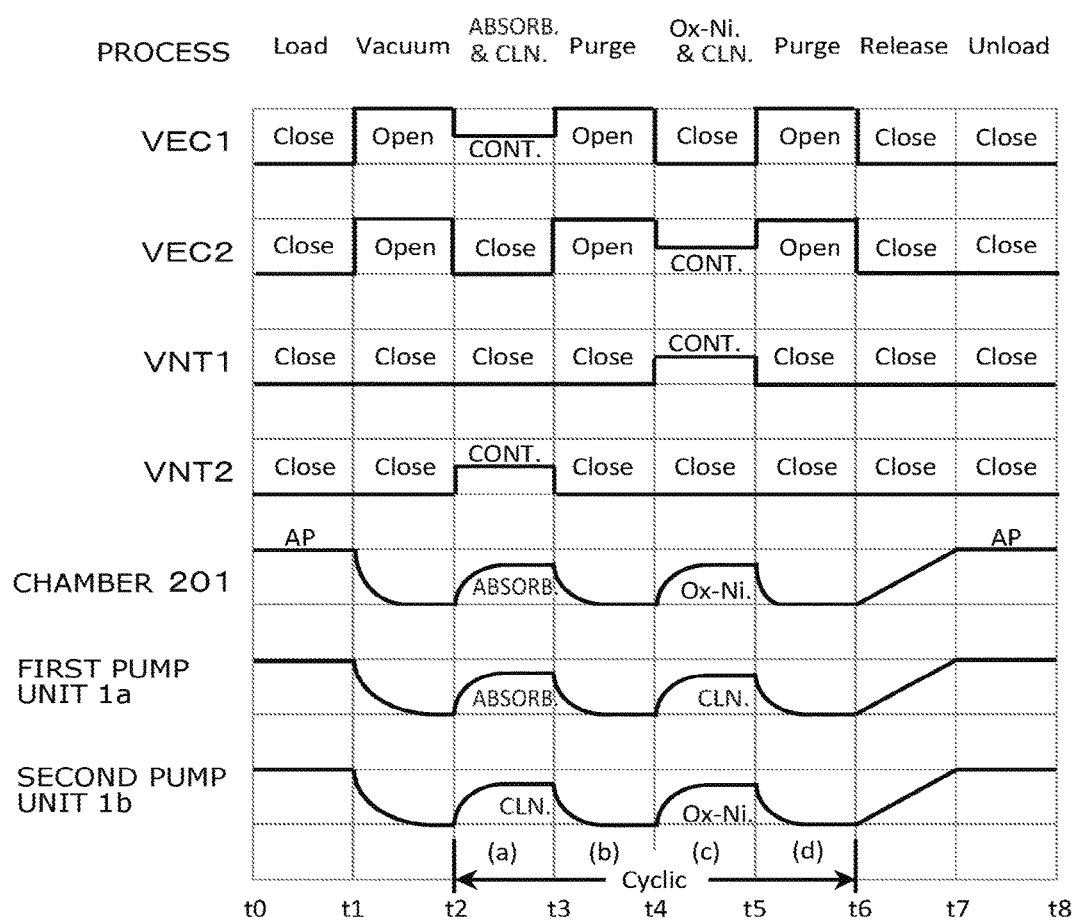
FIG. 7 is a timing chart showing a first example of the operation method.

FIG. 7 is a timing chart showing a first example of the operation method. The first example includes operation methods (A) and (B). The first example is, for example, an example of "cyclic introduction" in which two types of material gases are caused to flow alternately into the chamber.

1. Load (Load)

As shown in time t0 to t1 in FIG. 7, the processing body 203, e.g., a silicon wafer, is loaded into the chamber 201. In the loading, the pressure inside the chamber 201 is set to a pressure at which the loading of the processing body 203 is possible, e.g., atmospheric pressure (AP). The vacuum pump 101 is set to a standby state or a stopped state. For example, the valves VEC1, VEC2, VNT1, and VNT2 are controlled as follows.

VEC1: Close
VEC2: Close
VNT1: Close
VNT2: Close

2. Draw Vacuum (Vacuum)

As shown in time t1 to t2 in FIG. 7, after the processing body 203 is loaded, a vacuum is drawn in the chamber 201 interior.

When drawing the vacuum, the vacuum pump 101 is set to an operating state. For example, the valves VEC1, VEC2, VNT1, and VNT2 are controlled as follows.

VEC1: Open
VEC2: Open
VNT1: Close
VNT2: Close

The valves VEC1 and VEC2 each are set to the "open (Open)" state, e.g., the "full open (Full open)" state. The valves VNT1 and VNT2 each are set to the "close (Close)" state. Thereby, the chamber 201 interior is exhausted by the first pump unit 1a and the second pump unit 1b of the vacuum pump 101.

3. Cyclic Process (Cyclic)

As shown in time t2 to t6 in FIG. 7, after drawing the vacuum in the chamber 201, the film formation process of the thin film is started. In the embodiment, the film formation of a silicon oxynitride film is illustrated as one example. The film formation of the silicon oxynitride film of the embodiment uses cyclic introduction. In the film formation of the silicon oxynitride film using cyclic introduction, for example, (a) Adsorption of silicon
(b) Purge
(c) Oxynitriding of silicon
(d) Purge are repeated the designed number of times. Thereby, the silicon oxynitride film that has the designed film thickness is formed on the processing body 203. Further, in the embodiment, process (a) is (a) Adsorb the silicon and clean the pump unit, and process (c) is (c) Oxynitride the silicon and clean the pump unit.

(a) Adsorb the Silicon and Clean the Pump Unit (ADSORB. & CLN.)

As shown in time t2 to t3 in FIG. 7, silicon is adsorbed on the processing body 203 inside the chamber 201. Inside the chamber 201, a silicon material gas is supplied as the first material gas from the gas supply mechanism 202.

In the adsorbing and the cleaning, the vacuum pump 101 is set to the operating state. For example, the valves VEC1, VEC2, VNT1, and VNT2 are controlled as follows.

VEC1: CONT. (opening degree adjustment)
VEC2: Close
VNT1: Close
VNT2: CONT. (opening degree adjustment)

The valve VEC1 is set to the "opening degree adjustment (CONT.)" state. The valve VEC2 is set to the "close (Close)" state. The valve VNT1 is set to the "close (Close)" state. The valve VNT2 is set to the "opening degree adjustment (CONT.)" state. Thereby, the silicon material gas is supplied to the interior of the chamber 201 while the pressure of the interior is adjusted to, for example, a film formation pressure not more than atmospheric pressure (AP).

The interior of the chamber 201 is exhausted by the first pump unit 1a. A silicon material gas flows into the first exhaust chambers 11aB and 11aM of the first pump unit 1a from the chamber 201.

Conversely, the second pump unit 1b is not connected to the chamber 201 interior. Therefore, the silicon material gas does not flow into the second exhaust chambers 11bB and 11bM of the second pump unit 1b. Instead, in the embodiment, for example, a cleaning gas is supplied to the second exhaust chambers 11bB and 11bM from the gas supply mechanism 202.

(b) Purge (Purge)

As shown in time t3 to t4 in FIG. 7, after the adsorption of the silicon and the cleaning of the pump unit, the chamber 201 interior is purged.

In the purge, the vacuum pump 101 is set to the operating state; and, for example, the inert gas is supplied to the chamber 201 interior from the gas supply mechanism 202. For example, the valves VEC1, VEC2, VNT1, and VNT2 are controlled as follows.

VEC1: Open
VEC2: Open
VNT1: Close
VNT2: Close

The valves VEC1 and VEC2 each are set to the "open (Open)" state, e.g., the "full open (Full open)" state. The valves VNT1 and VNT2 are set to the "close (Close)" state. Thereby, the chamber 201 interior is exhausted by the first pump unit 1a and the second pump unit 1b while the inert gas is supplied.

(c) Oxynitride of the Silicon and Clean the Pump Unit (Ox-Ni. & CLN.)

As shown in time t4 to t5 in FIG. 7, the silicon that is adsorbed on the processing body 203 inside the chamber 201 is oxynitrided. An oxidative/nitrative gas is supplied as the second material gas from the gas supply mechanism 202 to the chamber 201 interior.

In the oxynitriding and the cleaning, the vacuum pump 101 is set to the operating state. For example, the valves VEC1, VEC2, VNT1, and VNT2 are controlled as follows.

VEC1: Close
VEC2: CONT. (opening degree adjustment)
VNT1: CONT. (opening degree adjustment)
VNT2: Close The valve VEC1 is set to the "close (Close)" state. The valve VEC2 is set to the "opening degree adjustment (CONT.)" state. The valve VNT1 is set to the "opening degree adjustment (CONT.)" state. The valve VNT2 is set to the "close (Close)" state. Thereby, the oxidative/nitrative gas is supplied to the interior of the chamber 201 while adjusting the pressure of the interior to, for example, an oxynitriding pressure not more than atmospheric pressure (AP).

The interior of the chamber 201 is exhausted by the second pump unit 1b. An oxidative/nitrative gas flows into the second exhaust chambers 11bB and 11bM from the chamber 201.

In the oxynitriding, the first pump unit 1a is not connected to the chamber 201 interior. Therefore, the oxidative/nitrative gas does not flow into the first exhaust chambers 11aB and 11aM. Instead, in the embodiment, for example, the cleaning gas is supplied to the first exhaust chambers 11aB and 11aM from the gas supply mechanism 202.

(d) Purge (Purge)

As shown in time t5 to t6 in FIG. 7, after the oxynitriding of the silicon and the cleaning of the pump unit, the chamber 201 interior is purged similarly to (b) purge.

In the purge, the vacuum pump 101 is set to the operating state; and, for example, the inert gas is supplied from the gas supply mechanism 202 to the chamber 201 interior. For example, the valves VEC1, VEC2, VNT1, and VNT2 are controlled as follows.

VEC1: Open
VEC2: Open
VNT1: Close
VNT2: Close

The valves VEC1 and VEC2 each are set to the "open (Open)" state, e.g., the "full open (Full open)" state. The valves VNT1 and VNT2 each are set to the "close (Close)" state. Thereby, the chamber 201 interior is exhausted by the first pump unit 1a and the second pump unit 1b while the inert gas is supplied.

In the embodiment as shown in FIG. 7, processes (a) to (d) are repeated the designed number of times (Cyclic). Thereby, the silicon oxynitride film that has the designed film thickness is formed on the processing body 203.

4. Open to the Atmosphere (Release)

As shown in time t6 to t7 in FIG. 7, after the cyclic process, the chamber 201 interior is opened to the atmosphere.

When open to the atmosphere, the vacuum pump 101 is set to the standby state or the stopped state. For example, the valves VEC1, VEC2, VNT1, and VNT2 are controlled as follows.

VEC1: Close
VEC2: Close
VNT1: Close
VNT2: Close

5. Unload (Unload)

As shown in time t7 to t8 in FIG. 7, the processing body 203 is unloaded from the chamber 201 after the pressure inside the chamber 201 is restored to a pressure at which the unloading of the processing body 203 is possible, e.g., atmospheric pressure (AP).

In the unloading, the vacuum pump 101 is set to the standby state or the stopped state. For example, the valves VEC1, VEC2, VNT1, and VNT2 are controlled as follows.

VEC1: Close
VEC2: Close
VNT1: Close
VNT2: Close

The first example of such an operation method is executed by the control of the control unit 300 shown in FIG. 6. In the first example of the operation method, the chamber 201 interior is exhausted by using the first pump unit 1a and the second pump unit 1b alternately. Therefore, it is possible to clean the second pump unit 1b by causing the cleaning gas to flow through the gas flow channel of the second pump unit 1b while the chamber 201 interior is exhausted by using the first pump unit 1a. Similarly, the first pump unit 1a can be cleaned by causing the cleaning gas to flow through the gas flow channel of the first pump unit 1a while the chamber 201 interior is exhausted by using the second pump unit 1b.

According to the first example of such an operation method, during the cyclic process, for example, it is possible to clean the first pump unit 1a and the second pump unit 1b alternately. Therefore, for example, the production of by-products caused by the material gases inside the gas flow channels of the vacuum pump 101 such as the first exhaust chambers 11aB and 11aM, the second exhaust chambers 11bB and 11bM, the exhaust pipe 6, etc., can be suppressed. Accordingly, the production of the by-products of the vacuum pump 101 is low; the adhesion in the pump and the plugging of the exhaust pipe 6 can be suppressed; and advantages can be obtained such as the pump life of the vacuum pump 101 can be improved.

Further, according to the first example of the operation method, the chamber 201 interior also can be exhausted by simultaneously using the first pump unit 1a and the second pump unit 1b. For example, this is during time t1 to t2, during time t3 to t4, and during time t5 to t6 shown in FIG. 7. By simultaneously using the first pump unit 1a and the second pump unit 1b, compared to the case where the chamber 201 interior is exhausted by using only one of the first pump unit 1a and the second pump unit 1b, the exhaust capacity of the vacuum pump 101 can be increased. Thus, for example, the vacuum pump 101 also can control the exhaust capacity in stages. According to the vacuum pump 101 of the embodiment, for example, the exhaust capacity can be controlled in the two stages of a "high exhaust capacity" and a "low exhaust capacity."

By increasing the exhaust capacity of the vacuum pump 101, for example, rapid exhausting of the chamber 201 interior is possible. If rapid exhausting of the chamber 201 interior is possible during the processes, the time necessary for the exhaust processes, e.g., "draw vacuum (Vacuum)" shown in time t1 to t2, "purge (Purge)" shown in time t3 to t4 and time t5 to t6 in FIG. 7, etc., can be shortened. According to the vacuum pump 101, in the case where a higher degree of vacuum is desired for the degree of vacuum of the chamber 201 interior, for example, the vacuum pump 101 is applicable also to the higher degree of vacuum that is desired.

According to the vacuum pump 101 including the exhaust system 100 according to the embodiment, as described in the first example of the operation method, for example, the advantages of (1) Improvement of the pump life is possible, and
(2) Improvement of the exhaust capacity is possible also can be obtained.

<Second Example of Operation Method>

Figure 8:
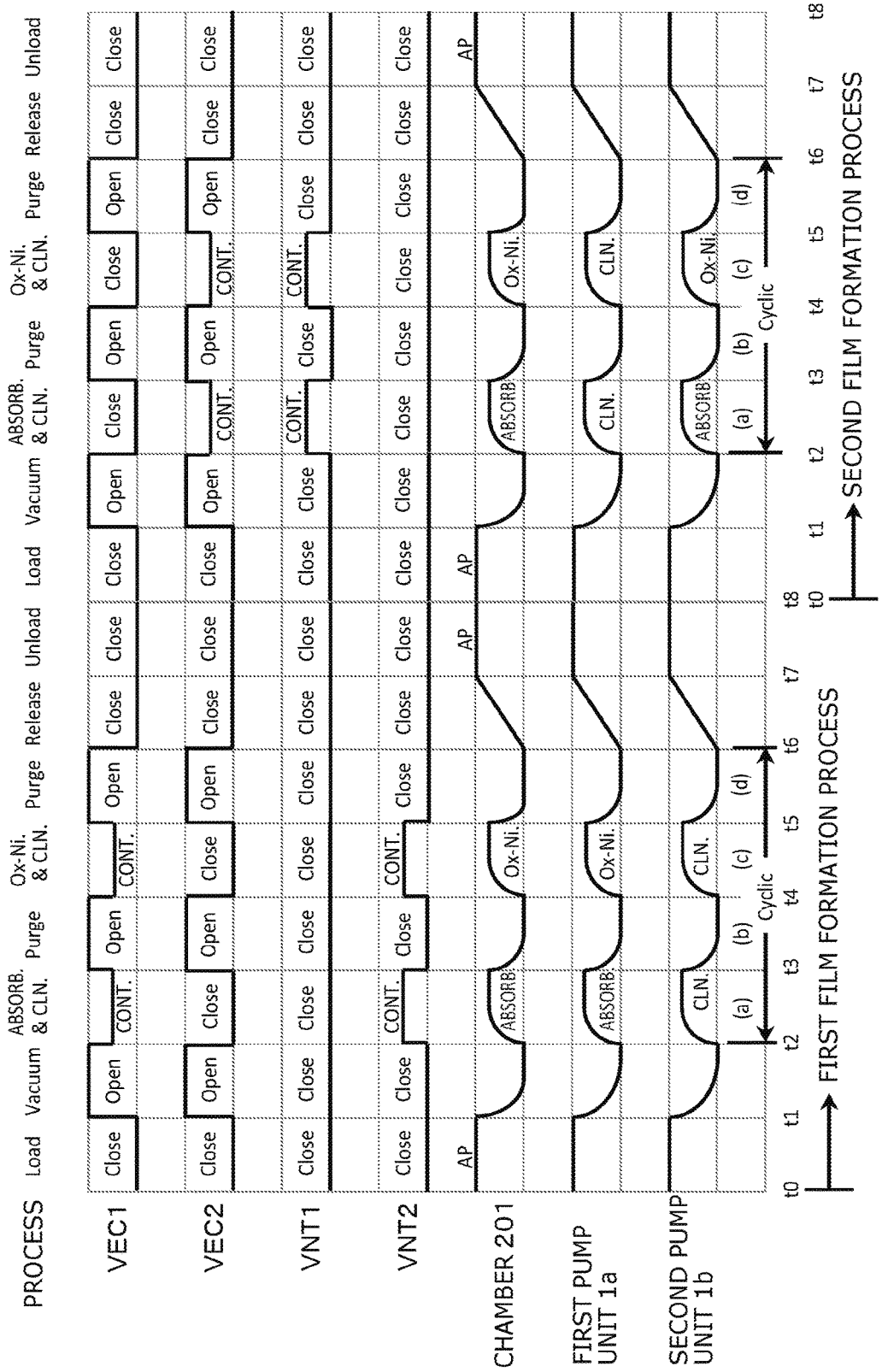
FIG. 8 is a timing chart showing a second example of the operation method.

FIG. 8 is a timing chart showing a second example of the operation method. The second example includes operation methods (B) and (C).

As shown in FIG. 8, the second example differs from the first example shown in FIG. 7 in that the first pump unit 1a and the second pump unit 1b are used in series. In the embodiment, "used in series" means that, for example, to exhaust the chamber 201 interior, the first pump unit 1a is used in the first film formation process; and the second pump unit 1b is used in the second film formation process. Or, this means that to exhaust the chamber 201, the first pump unit 1a is used in the first to nth film formation processes; and the second pump unit 1b is used in the (n+1)th to 2nth film formation processes. The former is illustrated in the second example.

1. First Film Formation Process

In the second example as shown in FIG. 8, for example, the chamber 201 interior is exhausted by using the first pump unit 1a in the interval shown in time t2 to t3 and the interval shown in time t4 to t5 of the first film formation process. In these intervals, for example, the cleaning gas is supplied to the second pump unit 1b from the gas supply mechanism 202. Thereby, the gas flow channel inside the second pump unit 1b, e.g., the interiors of the second exhaust chambers 11bB and 11bM, etc., are cleaned (referring to CLN. in FIG. 8).

During the cyclic process shown in time t2 to t6, in the case where the cleaning is no longer necessary such as when the cleaning of the second pump unit 1b has ended or in the case where the cleaning is unnecessary, the inert gas may be supplied instead of the cleaning gas from the gas supply mechanism 202 to the second pump unit 1b.

2. Second Film Formation Process

The second film formation process is started when the first film formation process has ended. The chamber 201 interior is exhausted by using the second pump unit 1b in the interval shown in time t2 to t3 and the interval shown in time t4 to t5 of the second film formation process. In these intervals, for example, the cleaning gas is supplied from the gas supply mechanism 202 to the first pump unit 1a. Thereby, for the first pump unit 1a used in the first film formation process, the gas flow channel inside the first pump unit 1a, e.g., the interiors of the first exhaust chambers 11aB and 11aB M, etc., are cleaned (referring to CLN. in FIG. 8).

In the case where the cleaning of the first pump unit 1a is unnecessary during the cyclic process (time t2 to t6) in the second film formation process, the inert gas may be supplied instead of the cleaning gas to the first pump unit 1a.

The second example of such an operation method also is executed by the control of the control unit 300 shown in FIG. 6.

According to the second example, the chamber 201 interior is exhausted by using the first pump unit 1a and the second pump unit 1b in series. Therefore, the second pump unit 1b can be cleaned while using the first pump unit 1a. Conversely, the first pump unit 1a can be cleaned while using the second pump unit 1b. Accordingly, similarly to the first example, the production of the by-products caused by the material gases in the gas flow channels of the first pump unit 1a and the second pump unit 1b can be suppressed.

In such a second example as well, similarly to the first example, the production of the by-products inside the gas flow channels of the vacuum pump 101 can be suppressed; and the adhesion in the pump and the plugging of the exhaust pipe 6 can be suppressed. Accordingly, advantages can be obtained such as the pump life of the vacuum pump 101 can be improved.

<Second Example of Semiconductor Manufacturing Equipment>

Figure 9:
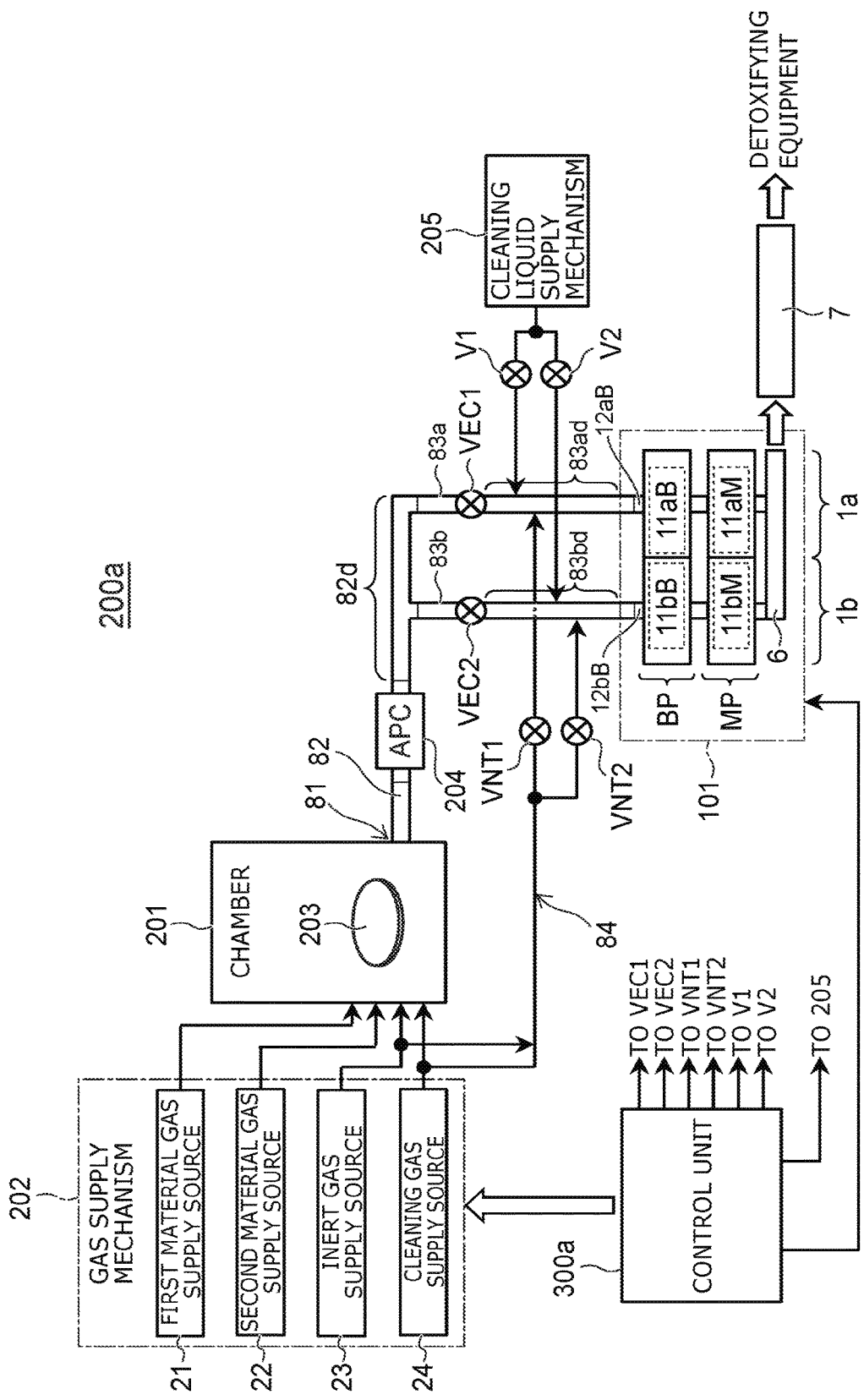
FIG. 9 is a schematic block diagram showing a second example of semiconductor manufacturing equipment using the vacuum pump.

FIG. 9 is a schematic block diagram showing a second example of semiconductor manufacturing equipment using the vacuum pump 101.

As shown in FIG. 9, the semiconductor manufacturing equipment 200a according to the second example differs from the semiconductor manufacturing equipment 200 shown in FIG. 6 in that a path in which the supply of a cleaning liquid in addition to the cleaning gas is possible is further included.

For example, the semiconductor manufacturing equipment 200a includes a cleaning liquid supply mechanism 205. The cleaning liquid supply mechanism 205 is connected to the downstream portion 83ad of the second exhaust pipe 83a via a valve V1 and is connected to the downstream portion 83bd of the third exhaust pipe 83b via a valve V2. The valves V1 and V2 are valves capable of allowing the cleaning liquid to flow.

As the cleaning liquid, for example, water, an etchant used to etch the thin film, etc., can be used. As water, for example, the use of deionized water or electrolytic water is possible.

Compared to the control unit 300 shown in FIG. 6, a control unit 300a of the semiconductor manufacturing equipment 200a also controls the cleaning liquid supply mechanism 205 and the valves V1 and V2. For example, the control unit 300a executes Cleaning liquid supply start/stop and cleaning liquid flow rate adjustment of the cleaning liquid supply mechanism 205

Open/close and opening degree adjustment of the valve V1

Open/close and opening degree adjustment of the valve V2 and the like according to, for example, a process recipe. It is also possible for the control unit 300a to execute the controls recited above according to an operation of the operator.

According to the semiconductor manufacturing equipment 200a according to the second example, the vacuum pump 101 can be cleaned using the two cleaning methods of the cleaning using the cleaning gas and the cleaning using the cleaning liquid. Therefore, compared to the cleaning using only the cleaning gas, cleaning in which it is possible to further increase the cleanliness can be performed for the vacuum pump 101.

Although the semiconductor manufacturing equipment 200a according to the second example includes the cleaning liquid supply mechanism 205, it may not be provided with the cleaning liquid supply mechanism 205. For example, it is also possible to provide the valve V1 connected to the downstream portion 83ad of the second exhaust pipe 83a, provide the valve V2 connected to the downstream portion 83bd of the third exhaust pipe 83b, and, for example, cause the cleaning liquid to flow manually by opening the valves V1 and V2 as necessary.

According to the semiconductor manufacturing equipment 200a according to the second example, for example, the following operation method is possible by the open/close control of the valves V1 and V2.

<Third Example of Operation Method>

Figure 10:
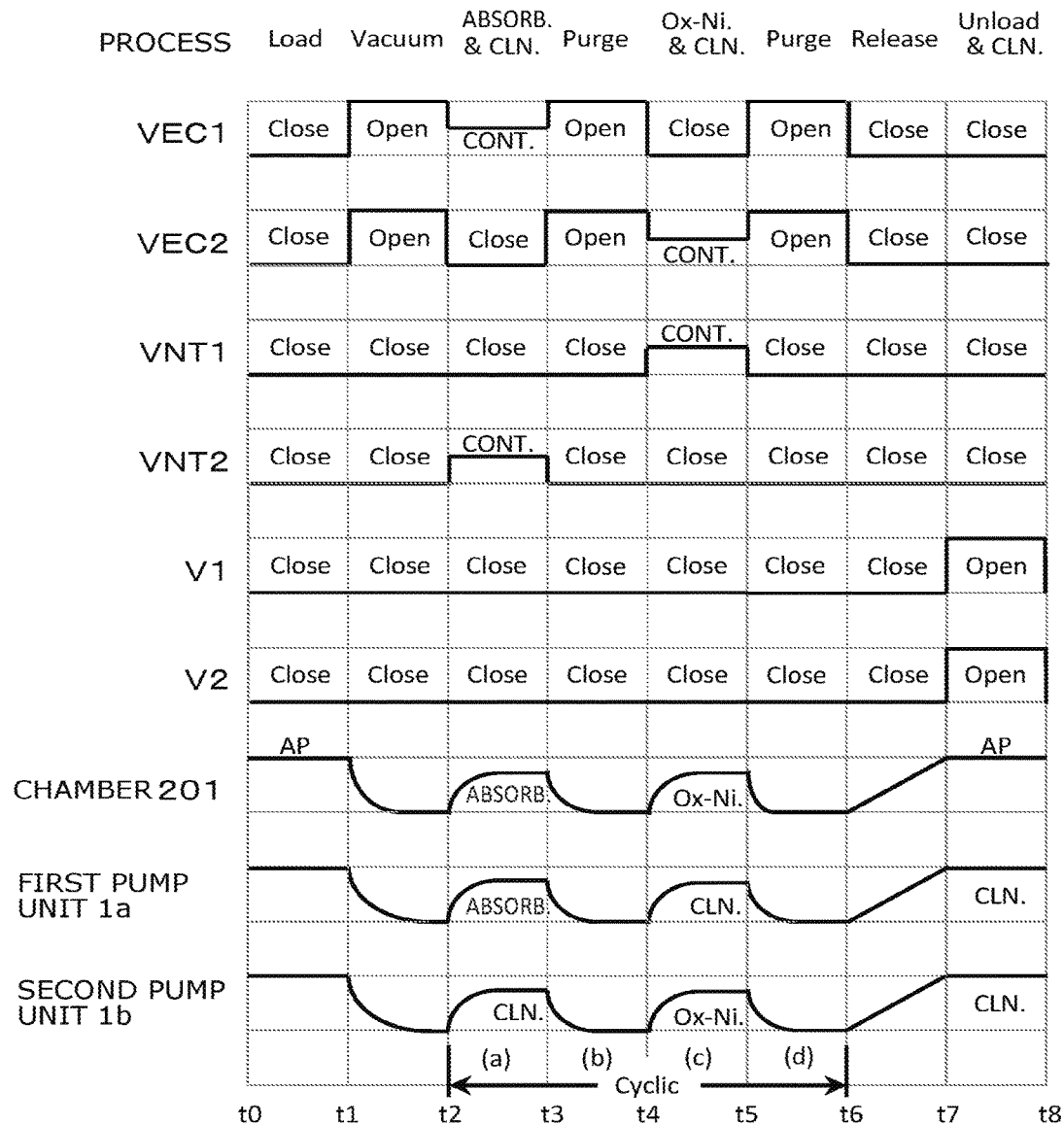
FIG. 10 is a timing chart showing a third example of the operation method.

FIG. 10 is a timing chart showing a third example of the operation method.

As shown in FIG. 10, the third example of the operation method is an example in which cleaning using a cleaning liquid is further combined with the first example of the operation method shown in FIG. 7. For example, the interval of time t0 to t7 shown in FIG. 10 is the same as the operation method described with reference to FIG. 7. In the interval of time t0 to t7, the valves V1 and V2 are controlled to be V1: Close V2: Close.

At time t6, the first pump unit 1a and the second pump unit 1b are open to the atmosphere (Release). Subsequently, at time t7, the pressure inside the first exhaust chambers 11aB and 11aM of the first pump unit 1a and the second exhaust chambers 11bB and 11bM of the second pump unit 1b are increased to reach a pressure suited to the cleaning using the cleaning liquid, e.g., atmospheric pressure (AP). In this state, the valves VEC1, VEC2, VNT1, VNT2, V1, and V2 are controlled as follows.

VEC1: Close

VEC2: Close

VNT1: Close

VNT2: Close

V1: Open

V2: Open

Thereby, in the interval of time t7 to t8, the vacuum pump 101 is disconnected from the chamber 201 by the valves VEC1 and VEC2. Similarly, the vacuum pump 101 is disconnected from the gas supply mechanism 202 by the valves VNT1 and VNT2. The vacuum pump 101 is connected to the cleaning liquid supply mechanism 205 via the valves V1 and V2. In this state, the cleaning of the vacuum pump 101 is performed using the cleaning liquid.

1. Unload and Clean (Unload & CLN.)

As shown in time t7 to t8 in FIG. 10, the unloading of the processing body 203 is performed inside the chamber 201. For example, the cleaning of the vacuum pump 101 using the cleaning liquid can be performed in parallel with the unloading of the processing body 203.

In the cleaning of the vacuum pump 101, the cleaning liquid from the cleaning liquid supply mechanism 205 is supplied to the first pump unit 1a and the second pump unit 1b. Thereby, in the first pump unit 1a, for example, the gas flow channels such as the interiors of the first exhaust chambers 11aB and 11aM, etc., are cleaned; and in the second pump unit 1b, for example, the gas flow channels such as the interiors of the second exhaust chambers 11bB and 11bM, etc., are cleaned.

In the cleaning using the cleaning liquid, for example, the rotation speed of the vacuum pump 101 is set to be lower than the rotation speed in the exhaust process. For example, the rotation speed of the vacuum pump 101 is set to be not more than a rotation speed at which the cleaning liquid does not freeze.

The third example of such an operation method is executed by the control of the control unit 300a shown in FIG. 9.

According to the third example of such an operation method, the vacuum pump 101 can be cleaned using the two cleaning methods of the cleaning using the cleaning gas and the cleaning using the cleaning liquid. Therefore, compared to the cleaning using only the cleaning gas, the cleanliness inside the gas flow channels of the vacuum pump 101 can be increased further.

Moreover, according to the third example of the operation method, the cleaning using the cleaning gas and the cleaning using the cleaning liquid are included inside the film formation process. Therefore, in the semiconductor manufacturing equipment 200a according to the second example, for example, the interval until the "maintenance" when the vacuum pump 101 and the exhaust pipe 6 are detached and disassembled can be extended.

According to such semiconductor manufacturing equipment 200a, the "operation stop interval" due to maintenance can be reduced; and advantages can be obtained such as the operation efficiency of the apparatus is increased.

Although an example is described in which the third example of the operation method is combined with the first example of the operation method, it is also possible to combine the third example of the operation method with the second example of the operation method.

Although an example is shown in the third example of the operation method in which the cleaning of the vacuum pump 101 using the cleaning liquid is performed, for example, in parallel with the "unload" of the processing body 203, this also can be performed in parallel with the "load" of the processing body 203.

<First Modification of Exhaust System>

Figure 11:
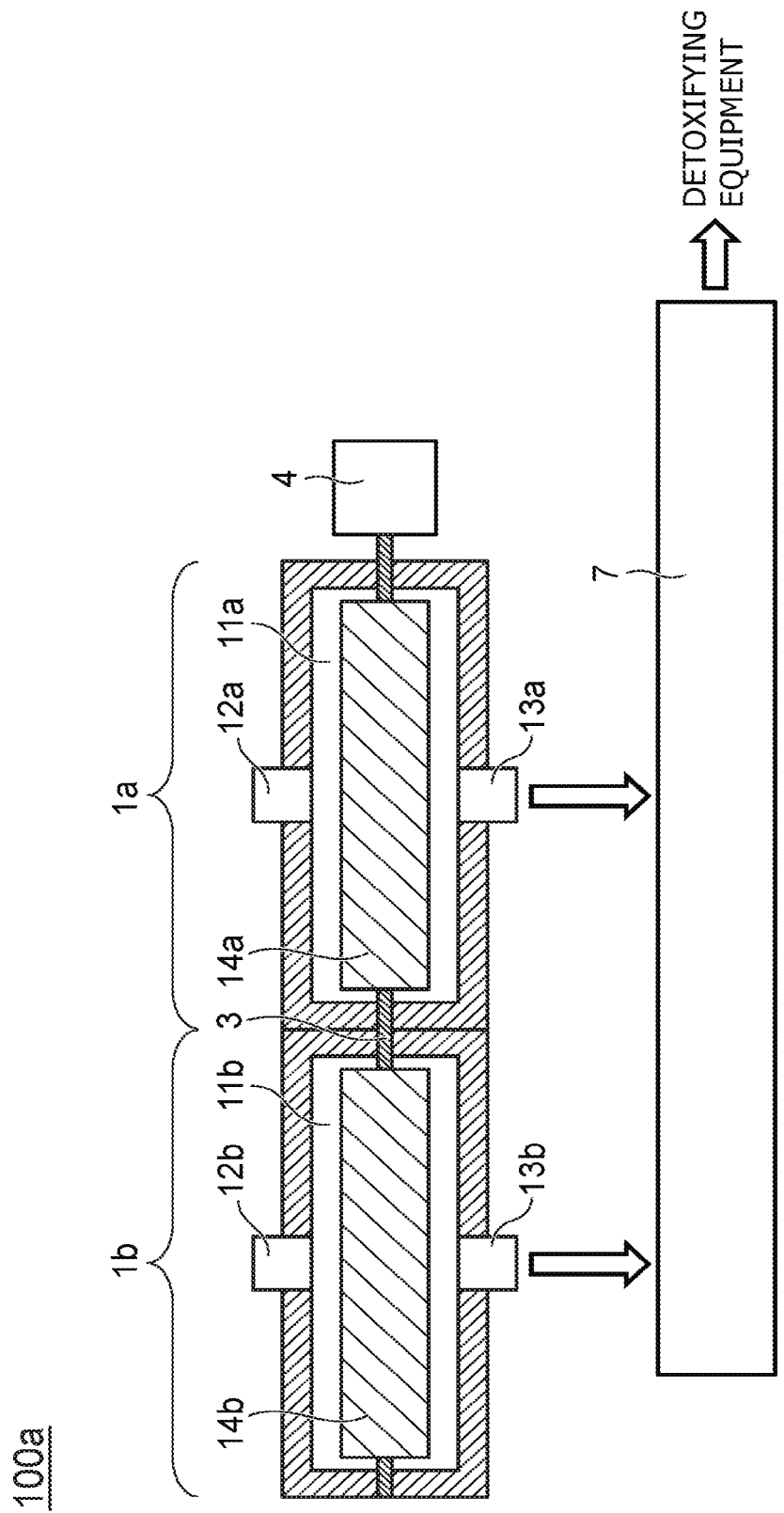
FIG. 11 is a schematic view showing an exhaust system according to a first modification.

FIG. 11 is a schematic view showing an exhaust system 100a according to a first modification. In FIG. 11, the basic configuration of the exhaust system 100a is shown summarily similarly to FIG. 1.

As shown in FIG. 11, the exhaust system 100a according to the first modification differs from the exhaust system 100 shown in FIG. 1 in that, for example, the first exhaust port 13a and the second exhaust port 13b are connected to the in-plant exhaust pipe 7 individually.

As in the exhaust system 100a, for example, the first exhaust port 13a and the second exhaust port 13b may not always be connected commonly to the exhaust pipe 6 which is one part of the vacuum pump 101. As shown in FIG. 11, for example, it is also possible to connect the first exhaust port 13a and the second exhaust port 13b individually to the in-plant exhaust pipe 7. Or, although not particularly illustrated, it is also possible to connect the first exhaust port 13a and the second exhaust port 13b individually to separate exhaust pipes mounted inside the plant.

The exhaust pipe 6 can be omitted according to the exhaust system 100a in which the first exhaust port 13a and the second exhaust port 13b are connected individually to, for example, the in-plant exhaust pipe 7. Therefore, the decrease of the conductance of the exhaust path of stages later than the first exhaust port 13a and the second exhaust port 13b caused by the exhaust pipe 6 can be suppressed. For example, if the exhaust pipe 6 is narrow, there is a possibility that the exhaust pipe 6 may become a "bottleneck" inside the exhaust path and cause the conductance to decrease. Therefore, there is a possibility that the exhaust capacity of the vacuum pump 101 cannot be realized sufficiently.

For such circumstances, because it is unnecessary to provide the exhaust pipe 6 according to the exhaust system 100a, for example, advantages can be further obtained such as the suppression of the decrease of the conductance of the exhaust path such as when the exhaust pipe 6 becomes a bottleneck.

<Second Modification of Exhaust System>

Figure 12:
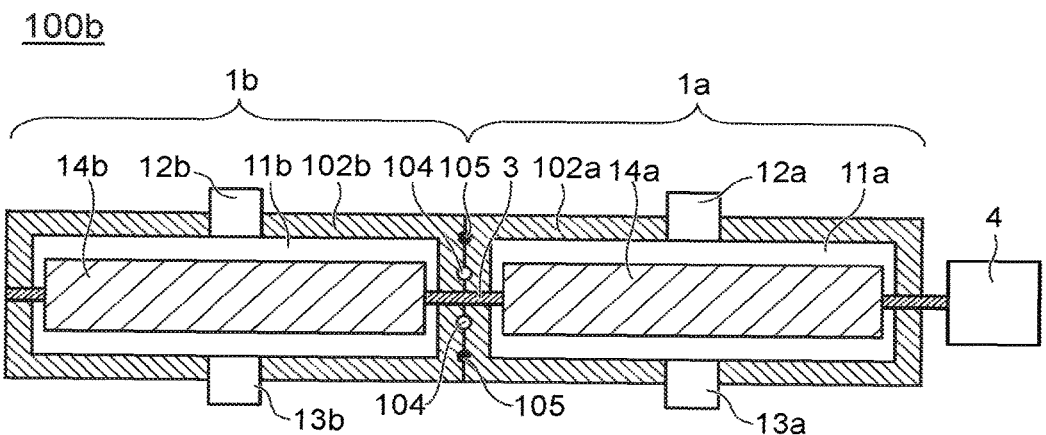
FIG. 12 is a schematic view showing an exhaust system according to a second modification.

FIG. 12 is a schematic view showing an exhaust system 100b according to a second modification. In FIG. 12, the basic configuration of the exhaust system 100b is shown summarily similarly to FIG. 1.

As shown in FIG. 12, the exhaust system 100b according to the second modification differs from the exhaust system 100 shown in FIG. 1 in that a gas passage 104 is included between a first housing 102a of the first pump unit 1a and a second housing 102b of the second pump unit 1b. The gas passage 104 can be provided by obtaining a "space" in which it is possible to cause a gas to flow by, for example, providing "depressions" in line configurations in the first housing 102a and the second housing 102b and by aligning the "depressions."

For example, in the exhaust system 100 of the embodiment shown in FIG. 1, the first rotor 14a and the second rotor 14b are rotated simultaneously by the shaft 3. The rotational speed of the first rotor 14a and the rotational speed of the second rotor 14b are, for example, the same. Therefore, a large pressure difference does not occur between the first exhaust chamber 11a and the second exhaust chamber 11b. Accordingly, high sealability is not always necessary between the first exhaust chamber 11a and the second exhaust chamber 11b. This is similar for the exhaust system 100b according to the second modification. Therefore, it is possible to use a sealant 105 between the first housing 102a and the second housing 102b that is general-purpose and inexpensive. For example, the gas passage 104 is provided between the sealant 105 and the shaft 3.

In the exhaust systems 100, 100a, and 100b of the embodiment, in the state in which the first rotor 14a and the second rotor 14b are caused to rotate, the "exhaust chamber cleaning" may be performed simultaneously for the first exhaust chamber 11a and the second exhaust chamber 11b; or the "chamber exhaust" and the "exhaust chamber cleaning" may be performed simultaneously for the first exhaust chamber 11a and the second exhaust chamber 11b. For example, these are the interval of time t2 to t3 and the interval of time t4 to t5 shown in FIG. 7, FIG. 8, and FIG. 10 and the interval of time t7 to t8 shown in FIG. 10. Therefore, in the pump operation, there is a possibility that, for example, the cleaning agent may enter along a micro gap between the first housing 102a and the shaft 3 and a micro gap occurring between the second housing 102b and the shaft 3.

In the case where it is desirable to suppress the entrance of such a cleaning agent, it is sufficient to provide the gas passage 104 between the first housing 102a and the second housing 102b as in the exhaust system 100b. In the state in which the first rotor 14a and the second rotor 14b are caused to rotate, a gas, e.g., an inert gas, is caused to flow inside the gas passage 104 while the "exhaust chamber cleaning" is being performed simultaneously or while the "chamber exhaust" and the "exhaust chamber cleaning" are being performed simultaneously. Or, the pressure inside the gas passage 104 is set to be higher than the pressures of the first exhaust chamber 11a and the second exhaust chamber 11b. Nitrogen gas is one example of the inert gas. By causing the inert gas to flow in the gas passage 104 or by increasing the pressure of the gas passage 104 interior, the inert gas can be caused to flow via the micro gap of the gas passage 104 periphery into the micro gap between the first housing 102a and the shaft 3 and the micro gap between the second housing 102b and the shaft 3. Thereby, the entrance of the cleaning agent into the periphery of the shaft 3 can be suppressed. The effect of suppressing the entrance of the cleaning agent can be obtained when the cleaning agent is a gas and when the cleaning agent is a liquid.

According to the exhaust system 100b according to the second modification, because the gas passage 104 is included between the first housing 102a and the second housing 102b, for example, the entrance of the cleaning agent between the first housing 102a and the shaft 3 and between the second housing 102b and the shaft 3 can be suppressed. Therefore, for example, it is possible to suppress an unexpected degradation progress of the shaft 3 caused by the entrance of the cleaning agent, etc.

<Third Example of Semiconductor Manufacturing Equipment>

Figure 13:
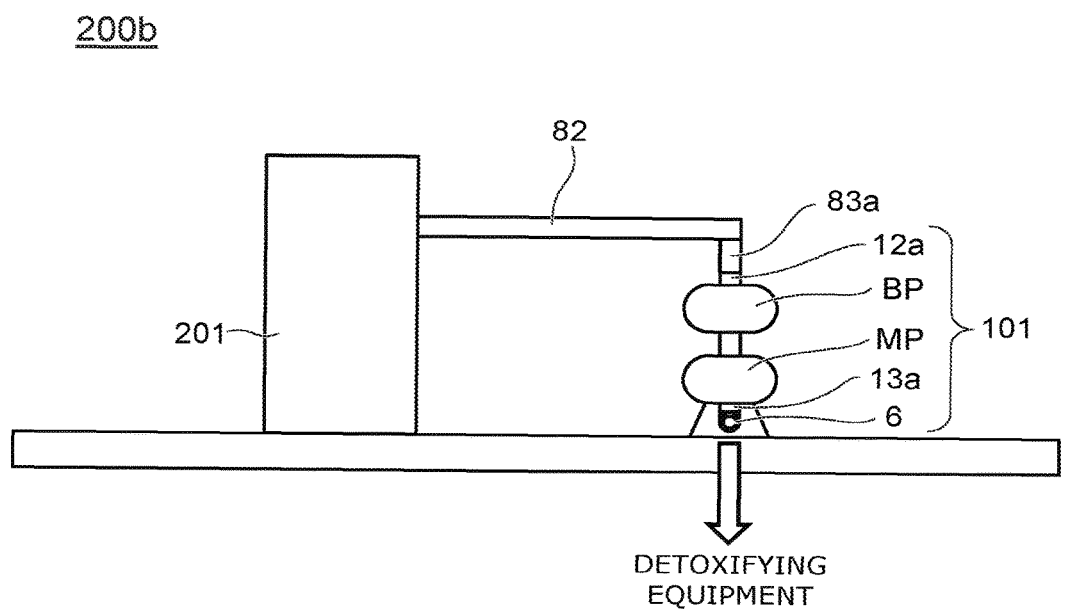
FIG. 13 is a schematic view showing a third example of semiconductor manufacturing equipment using a vacuum pump.

FIG. 13 is a schematic view showing a third example of semiconductor manufacturing equipment using a vacuum pump.

As shown in FIG. 13, the semiconductor manufacturing equipment 200b according to the third example is an example in which the vacuum pump 101 is mounted above-floor. In the semiconductor manufacturing plant, normally, the vacuum pump 101 is mounted lower than the chamber 201, e.g., below the floor of the chamber 201.

In the case where the vacuum pump 101 is mounted below the floor of the chamber 201, for example, the length of the second exhaust pipe (the second exhaust pipe 83a is shown in FIG. 13) is longer. Therefore, for example, the following circumstances occur.

The gas flow channels from the chamber 201 to the vacuum pump 101 easily become longer.

It is difficult to have uniform lengths of the gas flow channels from the chamber 201 to the vacuum pump 101.

From these circumstances, for example, the control of the conductance value of the gas flow channels becomes difficult in the case where the vacuum pump 101 is mounted below-floor.

Conversely, in the semiconductor manufacturing equipment 200b, the vacuum pump 101 is mounted above-floor; for example, the vacuum pump 101 is mounted on the same floor as the chamber 201.

According to such semiconductor manufacturing equipment 200b, compared to the case where the vacuum pump 101 is mounted below-floor, for example, it is possible to shorten the length of the second exhaust pipe (referring to reference numeral 83a in FIG. 13). Accordingly, it is easy to realize the shortening of the lengths of the gas flow channels and the uniformity of the lengths of the gas flow channels from the chamber 201 to the vacuum pump 101; and the control of the conductance value can be easy.

According to the semiconductor manufacturing equipment 200b, the vacuum pump 101 obtains the advantages that (1) Improvement of the pump life is possible, and
(2) Improvement of the exhaust capacity is possible; and the semiconductor manufacturing equipment 200b also is advantageous to improve the controllability of the conductance value of the gas flow channels of the vacuum pump 101.

Thus, according to the embodiments, an exhaust system in which improvement of the pump life is possible, semiconductor manufacturing equipment including the exhaust system, and an operation method of the exhaust system can be provided.

Hereinabove, embodiments are described. However, the embodiments are not limited to the embodiments recited above. These embodiments are presented as examples and are not intended to limit the scope of the invention. These novel embodiments may be implemented in other various forms; and various omissions, replacements, and modifications can be performed without departing from the spirit of the embodiments.

For example, although the two pump units of the first pump unit 1a and the second pump unit 1b are shown as the pump units in the embodiments, three or more pump units may be included.

The exhaust system 100a according to the first modification and the exhaust system 100b according to the second modification described in the embodiments also are applicable to, for example, any of the first to third examples of the semiconductor manufacturing equipment.

It is also possible to combine the first example of the operation method with the second example of the operation method described in the embodiments. Of course, it is also possible to combine all of the first to third examples of the operation method.

For example, the exhaust systems 100, 100a, and 100b according to the embodiments are not limited to vacuum pumps of semiconductor manufacturing equipment and are applicable to any manufacturing apparatus or system in which a vacuum pump is utilized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for operating an exhaust system, the exhaust system including:
   a first pump unit, the first pump unit including a first exhaust chamber, a first intake port, a first exhaust port, and a first rotor, the first intake port, the first exhaust port, and the first rotor being provided in the first exhaust chamber;
   a second pump unit, the second pump unit including a second exhaust chamber, a second intake port, a second exhaust port, and a second rotor, the second intake port, the second exhaust port, and the second rotor being provided in the second exhaust chamber;
a shaft, the shaft linking the first rotor and the second rotor;
a motor, the motor causing the first rotor, the second rotor, and the shaft to rotate, and
the first pump unit and the second pump unit configured to be connectable to a chamber and a gas supply mechanism, the method comprising:
making a first state in which the first pump unit is connected to the chamber performing processing of a processing body, and the second pump unit is disconnected from the chamber; and
making a second state in which the first pump unit is disconnected from the chamber, and the second pump unit is connected to the chamber,
wherein
the second pump unit is connected to the gas supply mechanism in the first state, and
the first pump unit is connected to the gas supply mechanism in the second state.

2. The method according to claim 1, wherein
a gas including a cleaning agent is supplied from the gas supply mechanism to the second pump unit in the first state, and
the gas including the cleaning agent is supplied from the gas supply mechanism to the first pump unit in the second state.

3. The method according to claim 2, wherein
the gas supply mechanism is connected to the chamber,
a first material gas is supplied from the gas supply mechanism to the chamber in the first state, and
a second material gas different form the first material gas is supplied from the gas supply mechanism to the chamber in the second state.

4. The method according to claim 1, wherein the first state and the second state are made alternately.

5. The method according to claim 1, wherein the first state and the second state are made in series.

6. The method according to claim 1, further comprising
making a third state in which the first pump unit and the second pump unit are connected simultaneously to the chamber.

7. The system according to claim 1, wherein
a structure of the first pump unit and a structure of the second pump unit are symmetric.

8. A method for operating an exhaust system,
the exhaust system including:
a first pump unit, the first pump unit including a first exhaust chamber, a first intake port, a first exhaust port, and a first rotor, the first intake port, the first exhaust port, and the first rotor being provided in the first exhaust chamber;
a second pump unit, the second pump unit including a second exhaust chamber, a second intake port, a second exhaust port, and a second rotor, the second intake port, the second exhaust port, and the second rotor being provided in the second exhaust chamber;
a shaft, the shaft linking the first rotor and the second rotor;
a motor, the motor causing the first rotor, the second rotor, and the shaft to rotate, and
a cleaning liquid supply mechanism configured to supply a cleaning liquid to the first pump unit and the second pump unit,
the first pump unit and the second pump unit configured to be connectable to a chamber,
the method comprising:
making a first state in which the first pump unit is connected to the chamber performing processing of a processing body, and
the second pump unit is disconnected from the chamber; and
making a second state in which the first pump unit is disconnected from the chamber, and the second pump unit is connected to the chamber; and
making a third state in which the first pump unit and the second pump unit are simultaneously disconnected from the chamber, and the first pump unit and the second pump unit are simultaneously connected to the cleaning liquid supply mechanism,
wherein
rotation speeds of the first and second pump units in the third state are set lower than the rotation speeds of the first and second pump units in the first and the second states.

9. The method according to claim 8, wherein the first state and the second state are made alternately.

10. The method according to claim 8, wherein the first state and the second state are made in series.

11. The method according to claim 8, further comprising
making a fourth state in which the first pump unit and the second pump unit are connected simultaneously to the chamber.

12. The system according to claim 8, wherein
a structure of the first pump unit and a structure of the second pump unit are symmetric.

13. A semiconductor manufacturing equipment comprising:
a chamber configured to perform processing of a processing body;
a gas supply mechanism configured to supply a gas to the chamber, the gas being used in the processing; and
an exhaust system configured to exhaust the chamber,
the exhaust system comprising:
a first pump unit, the first pump unit including a first exhaust chamber, a first intake port, a first exhaust port, and a first rotor, the first intake port, the first exhaust port, and the first rotor being provided in the first exhaust chamber;
a second pump unit, the second pump unit including a second exhaust chamber, a second intake port, a second exhaust port, and a second rotor, the second intake port, the second exhaust port, and the second rotor being provided in the second exhaust chamber;
a shaft, the shaft linking the first rotor and the second rotor; and
a motor, the motor being configured to cause the first rotor, the second rotor, and the shaft to rotate;
wherein the chamber includes a chamber exhaust port,
and the semiconductor manufacturing equipment further comprising:
a first exhaust pipe connected to the chamber exhaust port;
a second exhaust pipe connected to the first exhaust pipe and the first intake port of the exhaust system;
a third exhaust pipe connected to the first exhaust pipe and the second intake port of the exhaust system;
a first valve provided in the second exhaust pipe; and
a second valve provided in the third exhaust pipe,
and further comprising:
a vent line connected to the gas supply mechanism, wherein
the gas supply mechanism is configured to further supply a cleaning gas, and
a supply path of the cleaning gas includes
a first path via the chamber; and
a second path via the vent line.

14. The equipment according to claim 13, wherein the exhaust system is provided on same floor as the chamber.

15. The equipment according to claim 13, wherein the second path is
connected to a first portion of the second exhaust pipe between the first valve and the first intake port, and
connected to a second portion of the third exhaust pipe between the second valve and the second intake port.

16. The equipment according to claim 15, wherein the second path is
connected to the first portion via a third valve, and
connected to the second portion via a fourth valve.

17. The system according to claim 7, wherein a structure of the first pump unit and a structure of the second pump unit are symmetric.

* * * * *